(12) United States Patent
Lin et al.

(10) Patent No.: US 7,187,917 B2
(45) Date of Patent: Mar. 6, 2007

(54) CURRENT INTERPOLATION IN MULTI-PHASE LOCAL OSCILLATOR FOR USE WITH HARMONIC REJECTION MIXER

(75) Inventors: Heng-Chih Lin, Plano, TX (US); Ranjit Gharpurey, Ann Arbor, MI (US)

(73) Assignee: Texas Instruments Incorporated, Dallas, TX (US)

( * ) Notice: Subject to any disclaimer, the term of this patent is extended or adjusted under 35 U.S.C. 154(b) by 362 days.

(21) Appl. No.: 10/811,584

(22) Filed: Mar. 29, 2004

(65) Prior Publication Data

US 2005/0215223 A1  Sep. 29, 2005

(51) Int. Cl.
  *H04B 1/26* (2006.01)
(52) U.S. Cl. ............. 455/323; 455/318; 455/317; 455/258; 327/100; 327/119; 375/284; 375/296
(58) Field of Classification Search ............ 455/317, 455/323, 318, 313, 561, 550.1, 333, 575.1, 455/424, 425, 456.5, 456.6, 20, 22, 209, 455/258, 255, 273, 276.1, 63.1, 501, 67.13, 455/86, 67.11, 91, 112, 207, 302, 285, 296, 455/114.1, 114.2, 118, 131, 189.1, 190.1, 455/283, 295; 327/359, 356, 113, 121, 100, 327/355, 231, 357, 119–120, 235, 246, 247; 375/308, 329, 284, 285, 296; 329/304–306
See application file for complete search history.

(56) References Cited

U.S. PATENT DOCUMENTS 3,296,517 A * 1/1967 Routh et al. ............. 327/231

5,574,755 A * 11/1996 Persico ...................... 375/295
5,808,498 A *  9/1998 Donnelly et al. ......... 327/255

(Continued)

OTHER PUBLICATIONS

Weldon, J. A.; Rudell, J.C.; Lin, L; Narayanaswami, R. S.; Otsuka, M.; Dedieu, S; Tee, L.; Tsai, K-C; Lee, C-W; and Gray, P. R.; "A 1.75 GHz Highly-Integrated Narrow-Band CMOS Transmitter with Harmonic-Rejection Mixers," Section 10.4 of *Digest of Technical Papers* of the *2001 IEEE International Solid-State Circuits (ISSC) Conference*, Feb. 5-7 2001, pp. 160-162.

(Continued)

*Primary Examiner*—Edward F. Urban
*Assistant Examiner*—Charles Chow
(74) *Attorney, Agent, or Firm*—Steven A. Shaw; W. James Brady; Frederick J. Telecky, Jr.

(57) ABSTRACT

A circuit provides a reduced harmonic content output signal OUTA and/or OUTB that is modulated according to an input signal 231. The circuit has an oscillator circuit 210 and a harmonic rejection mixer (HRM) 230. The oscillator circuit 210 includes at least one "circuit portion" (FIG. 2A) configured to receive first and second orthogonal oscillator input signals (two of I, I−, Q, Q−) having respective first and second phases, and to provide an arbitrarily large number of oscillator output signals (φM) having respective mutually distinct phases that are interpolated between the first and second phases. Harmonic rejection mixer 230 is configured to use the input signal to modulate a combination of the oscillator output signals, the oscillator output signals being respectively weighted so as to provide an emulated sinusoidal signal constituting the reduced harmonic content output signal.

18 Claims, 4 Drawing Sheets

U.S. PATENT DOCUMENTS

| | | | |
|---|---|---|---|
| 6,242,965 B1 * | 6/2001 | Pickering et al. | 327/359 |
| 6,359,486 B1 * | 3/2002 | Chen | 327/231 |
| 6,359,523 B1 * | 3/2002 | Kuwano | 332/103 |
| 6,373,345 B1 * | 4/2002 | Kimppa et al. | 332/105 |
| 6,417,712 B1 * | 7/2002 | Beards et al. | 327/248 |
| 6,512,408 B2 * | 1/2003 | Lee et al. | 327/359 |
| 2003/0016762 A1 * | 1/2003 | Martin et al. | 375/308 |
| 2004/0005869 A1 * | 1/2004 | See et al. | 455/102 |
| 2005/0032486 A1 * | 2/2005 | Malone et al. | 455/118 |
| 2005/0175132 A1 * | 8/2005 | Yang | 375/350 |

OTHER PUBLICATIONS

Magoon, R., Molnar, A., Zachan, J., Hatcher, G., and Rhee, W., "A single-chip quad-band (850/900/1800/1900MHz) Direct Conversion GSM/GPRS RF Transceiver with Integrated VCOs and Fractional-N Synthesizer," *IEEE Journal of Solid-State Circuits*, vol. 37, No. 12, Dec. 2002, pp. 1710-1720.

* cited by examiner

CURRENT INTERPOLATION IN MULTI-PHASE LOCAL OSCILLATOR FOR USE WITH HARMONIC REJECTION MIXER

BACKGROUND OF THE INVENTION

1. Field of the Invention

The invention generally relates to generation of differently phased oscillator signals for use in harmonic rejection mixers (HRMs). More particularly, the invention relates to providing HRMs with an arbitrarily large number of differently-phased local oscillator (LO) signals to reject substantially more harmonics ("images") than conventional arrangements, especially using LO signals that are not dependent on phase lock loop (PLL) frequency dividers to divide a high-frequency signal to a suitable LO frequency.

2. Related Art

Harmonic-rejection mixers (HRMs), which are designed to reject local oscillator (LO) harmonics (or "images"), are known in the art. See, for example, "A 1.75 GHz Highly-Integrated Narrow-Band CMOS Transmitter with Harmonic-Rejection Mixers" Weldon, J. A.; Rudell, J. C.; Lin, L; Narayanaswami, R. S.; Otsuka, M.; Dedieu, S; Tee, L.; Tsai, K-C; Lee, C-W; and Gray, P. R.; Section 10.4 of *Digest of Technical Papers of the* 2001 *IEEE International Solid-State Circuits (ISSC) Conference,* 5–7 Feb. 2001, pages 160–162 (hereinafter called "the Weldon et al. reference"). FIG. 1 shows part of FIG. 10.4.1 from the Weldon et al. reference.

In FIG. 1, orthogonal (quadrature) I and Q signals pass through respective digital-to-analog converters (DACs) and low pass filters (LPFs) to reach four harmonic rejection mixers (HRMs). Also input to the HRMs are local oscillator (LO) signals $\phi 1$, $\phi 2$, $\phi 3$, $\phi 4$, provided from a phase divider. The input to the phase divider is provided by a phase lock loop (PLL) that runs from a crystal oscillator XTAL and has a much higher frequency than the LO frequency. Within the PLL, a first frequency divider D1, a phase difference detector $\Delta$, a voltage controlled oscillator VCO, and a feedback frequency divider D2, are provided in a conventional PLL arrangement. Outputs of the four HRMs are subtracted or added, pair-wise, to provide intermediate frequency (IF) signals that are subsequently subjected to further mixing and summing, downstream.

Undesirably, conventional square wave LOs generate a significant amount of odd harmonics. For example, if a LO has a fundamental frequency of 100 MHz, then significant harmonics are generated at odd multiples thereof, namely, at 300 MHz, 500 MHz, 700 MHz, and so forth. Unfortunately, these harmonics mix with the modulated information signals. Harmonics that are close in frequency to the fundamental frequency are difficult to filter or otherwise eliminate, using conventional techniques.

Weldon et al. generate four-phase LOs (two pairs of orthogonal signals) and sum the LO signals of different phases. In this manner, Weldon et al. creates a very rough "stair step" approximation of a sin wave at the LO output. Weldon's FIG. 10.4.2 shows the details of an HRM that performs this rough "stair step" approximation. In providing even this rough "stair step" approximation, Weldon et al. reduce the magnitude of some lower-order harmonics, as compared to a conventional purely square wave LO. The Weldon et al. reference states that their arrangement significantly rejects the third and fifth harmonics (−68 and −69 dB, respectively).

In the Weldon et al. reference, as in many conventional arrangements, the generation of multiple phases $\phi 1$, $\phi 2$, $\phi 3$, $\phi 4$ has been achieved using a phase lock loop, or a combination of a PLL and a divider. Unfortunately, such conventional arrangements severely limit the number of phases available for a particular LO frequency. In Weldon's example, only four phases are produced at the LO output, substantially limiting the closeness with which a LO output can emulate a sinusoidal output, thus frustrating rejection of higher harmonics.

Because of difficulties in filtering out "close" (lower-order) harmonics, especially in modern systems having increasingly higher fundamental frequencies, there is a need in the art to reject not only the third and fifth harmonics, but also the seventh, ninth, and further harmonics. This need could be fulfilled by providing an HRM output that more closely emulates a sinusoidal signal, but with the limited number of LO phases available in conventional arrangements, this need has not been fulfilled. Accordingly, there is also a need in the art to generate an arbitrarily large number of LO phases, based on orthogonal I and Q signals, to ultimately allowing higher-order harmonics to be rejected in harmonic rejection mixers.

Furthermore, Weldon's conventional 4-phase generation method is not applicable for all possible LO frequencies. That is, the PLL frequency needs to be a multiple of the desired LO frequency, a requirement that limits the applications that can use the HRM. Thus, there is a further need in the art to provide an arrangement for generating a large number of LO phases, at a frequencies that can be flexibly chosen rather than being limited to a limited number of frequencies.

SUMMARY

A circuit provides a reduced harmonic content output signal that is modulated according to an input signal. The circuit has an oscillator circuit and a harmonic rejection mixer (HRM). The oscillator circuit includes at least one "circuit portion" configured to receive first and second orthogonal oscillator input signals having respective first and second phases, and to provide an arbitrarily large number of oscillator output signals having respective mutually distinct phases that are interpolated between the first and second phases. The harmonic rejection mixer is configured to use the input signal to modulate a combination of the oscillator output signals, the oscillator output signals being respectively weighted so as to provide an emulated sinusoidal signal constituting the reduced harmonic content output signal.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which:

FIG. 2B illustrates how the MOSFET gate inputs of the MPLO circuit portions of FIG. 2A may be driven by I, Q, I−, Q− input signals, and FIG. 2C illustrates one example of how the drains and sources of the MPLO circuit portions of FIG. 2A may be connected;

DETAILED DESCRIPTION

Figure 1:
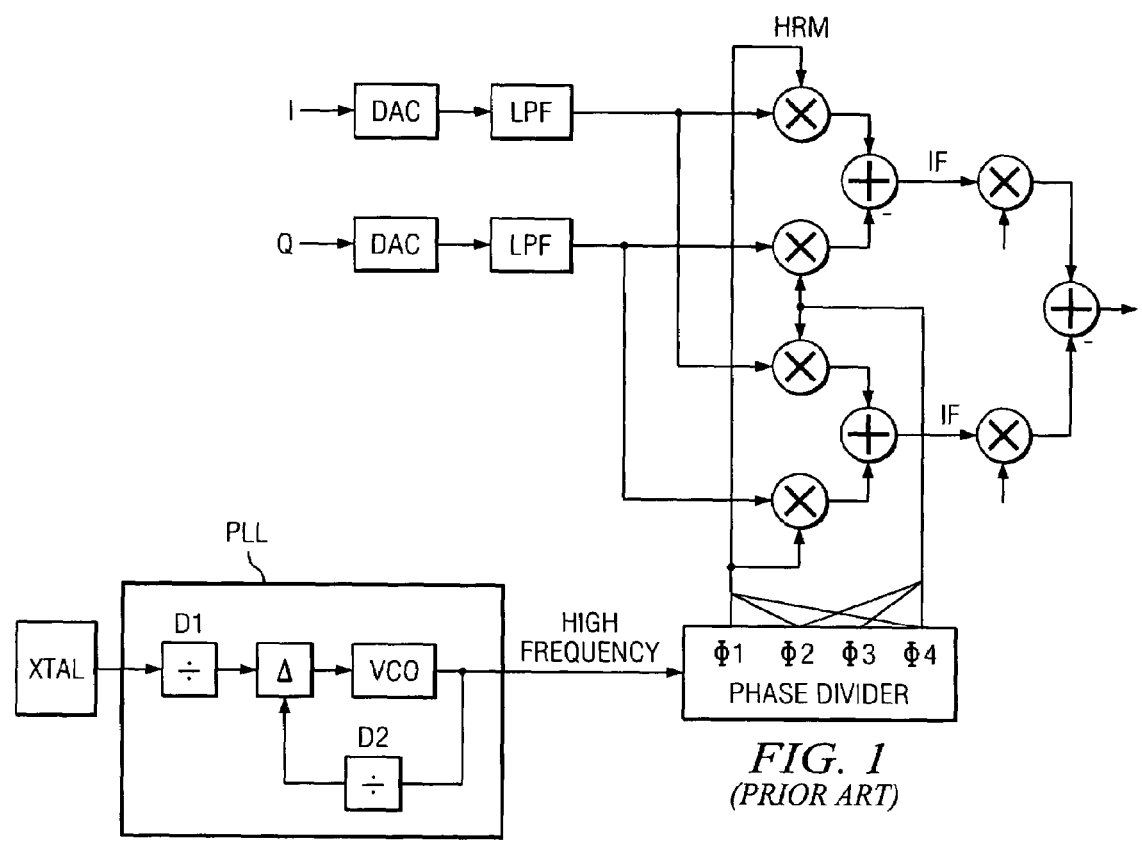
FIG. 1 illustrates a conventional circuit in which the output of a crystal must be frequency-multiplied in a phase lock loop to allow a phase divider to provide only four phases of a signal used in an image/harmonic-rejection up-conversion mixer.

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used in interpreting the claims.

Moreover, features and procedures whose implementations are well known to those skilled in the art are omitted for brevity. For example, design, selection, and implementation of basic electronic circuit elements such as signal level shifters, buffers, load balancing elements, grounding elements, bias elements, current mirror arrangements, logic elements, current and voltage sources, metal oxide semiconductor field effect transistors (MOSFETs), diodes (including "MOSFET diodes"), digital-to-analog converters (DACs) including differential DACs, and the like, lie within the ability of those skilled in the art, and accordingly any detailed discussion thereof may be omitted.

As used herein, "current domain" or "current mode" (distinguished from voltage domain or voltage mode) means that the electrical quantities that directly or indirectly represent the baseband input signal are electric currents (not voltages). Normally, these currents come in pairs, and are differential current signals, so that the information is carried by a difference between the two currents.

In the present description, it is understood that, based on context, symbols M and N may be used as index values (example: 1, 2, 3, 4, 5, 6), as well as the maximum value that the index can assume (example: 6). Lower-case symbols m and n typically refer to particular index values, in which it is assumed $m \leq M$ and $n \leq N$.

Phase symbols such as $\phi x$ and $\phi x-$ generally denote signals of opposite relative phase. The presence of a minus sign "−" after a $\phi$ designator does not imply a "negative" phase (negative with respect to an absolute reference phase); rather, the minus sign "−" merely denotes a relative phase difference of 180°.

Unlike traditional PLL (or PLL and divider) approaches such as that described in the Background, the present approach is applicable to any LO frequency, not only frequencies that are the result of, for example, frequency-dividing a high frequency signal. Moreover, the use of extensive current interpolation on LO signals with many phases, and the weighted summation of those many-phased signals to closely emulate a sinusoidal LO signal, improve output signal linearity and enhance mixing gain while rejecting substantially more harmonics than conventional arrangements.

Figure 2:
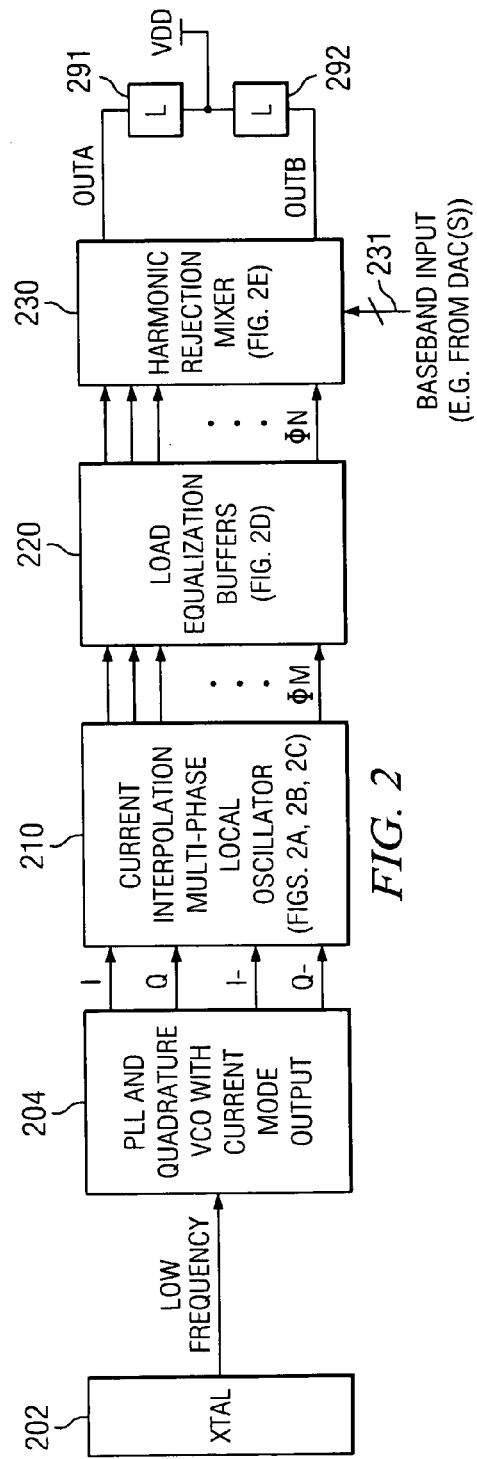
FIG. 2 is a high-level block diagram illustrating one embodiment of an arrangement of current interpolation in a multi-phase local oscillator (MPLO) for an HRM (harmonic rejection mixer), the details of which are illustrated in FIGS. 2A–2E.

FIG. 2 is a high-level block diagram illustrating one embodiment of an arrangement of current interpolation in multi-phase local oscillator (MPLO) for a harmonic rejection mixer (HRM). The details of one embodiment of FIG. 2 are illustrated in FIGS. 2A–2E.

FIG. 2 illustrates a frequency source 202, which may be a conventional crystal oscillator XTAL. The frequency from source 202 is fed to an element 204, which may be conventional in design. Element 204 may include a PLL and quadrature (orthogonal) voltage-controlled oscillator (VCO), which in one embodiment provides current mode outputs. Element 204 provides two pairs of orthogonal (for example, quadrature) signals, hereinafter labeled I, Q, I−, and Q−. It is understood that I and Q are orthogonal (for example, quadrature) signals, while I and I− are opposite in phase, and Q and Q− are opposite in phase.

Figure 2A:
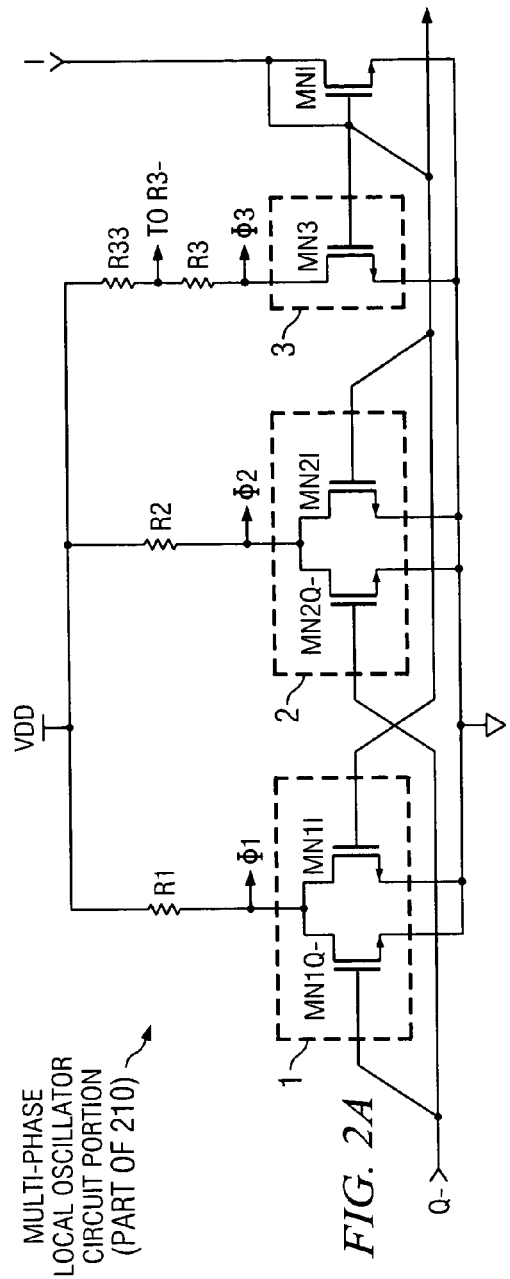
FIG. 2A illustrates one embodiment of an "MPLO circuit portion", the "MPLO circuit portion" being repeated a number of times (for example, four times) to collectively form MPLO 210 (FIG. 2)
Figure 2B:
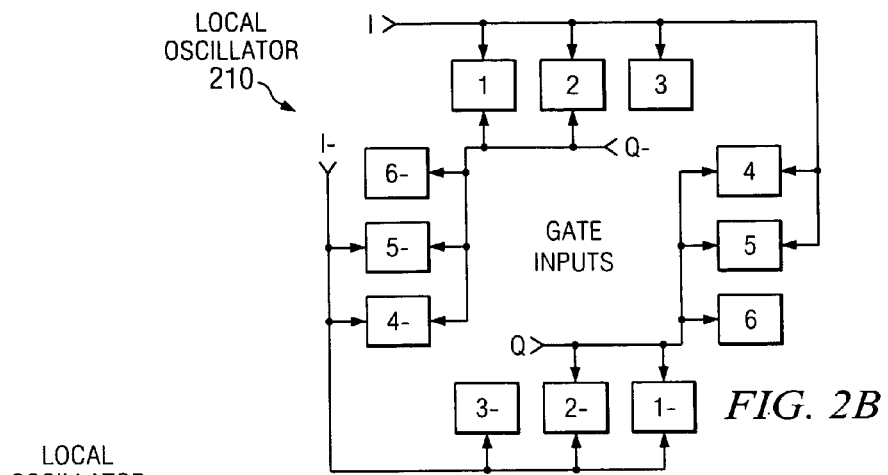
FIGS. 2B, 2C illustrate one example of how metal oxide semiconductor field effect transistors (MOSFETs) of the "MPLO circuit portions" of FIG. 2A may be connected, in one embodiment of an MPLO; more specifically.
Figure 2C:
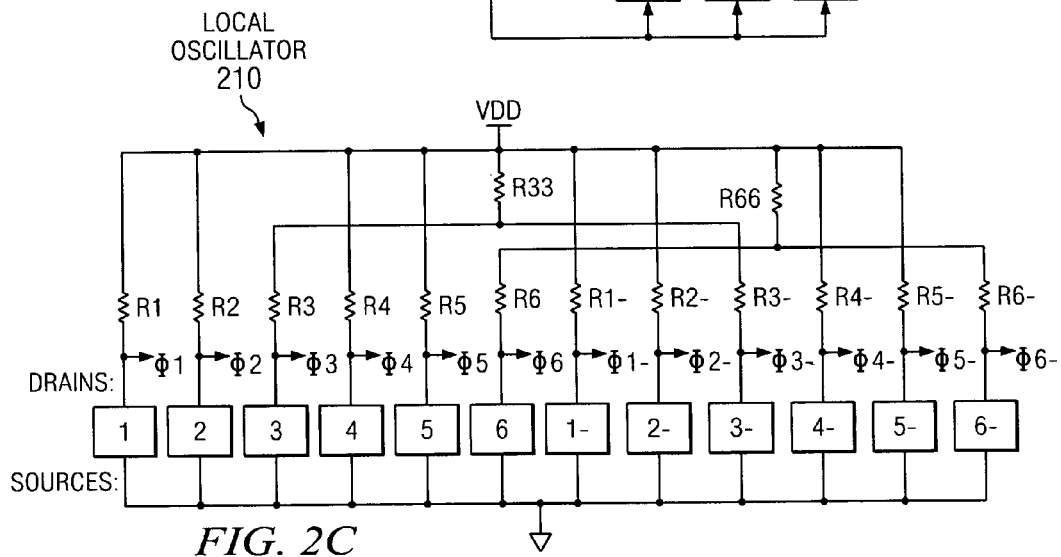

The I, Q, I−, and Q− signals from quadrature VCO 204 are input to a current interpolation multi-phase local oscillator 210 (hereinafter, "MPLO 210" or in certain contexts, "LO"). Essentially, MPLO 210 outputs an arbitrarily large number 2M of signals that can have 2M mutually distinct phases. In one embodiment, the 2M phases are "evenly-spaced" phases. Details of one embodiment of MPLO 210 in which M=6 are shown in FIGS. 2A, 2B, 2C, described below.

Significantly, the VCO frequency in element 204 may have the same frequency as the 2M LO signals output by the MPLO 210. This flexibility contrasts with the Weldon et al. arrangement, in which the VCO frequency is very high.

MPLO 210 provides these 2M phased LO signals, which may be collectively called $\phi M$ (individually, $\phi m$ or $\phi m-$), to an array of (for example) M=N=6, load equalization buffers 220. Load equalization buffers 220 provide respective buffered signals (collectively, $\phi N$) to harmonic rejection mixer (HRM) 230. Buffers in element 220 may be constructed in accordance with FIG. 2D, discussed below.

In response to a baseband input signal on line 231, HRM 230 provides modulated up-converted output signals OUTA and OUTB on opposite sides of connect load elements 291, 292. In one embodiment, OUTA and OUTB are current-domain signals, and accordingly a node between loads 291, 292 is held to a supply voltage VDD.

Throughout this disclosure, a specific example is presented for the sake of providing a concrete description. The presented example involves use of I, Q, I−, Q− input signals to generate M=N=6 pairs of output signals $\phi 1$, $\phi 1-$, $\phi 2$, $\phi 2-$, $\phi 3$, $\phi 3-$, $\phi 4$, $\phi 4-$, $\phi 5$, $\phi 5-$, $\phi 6$, $\phi 6-$, which are ultimately used in HRM 230 (possibly after load equalization). Of course, the presented example with M=N=6 is merely illustrative and not exclusive in any way; and the scope of the invention should not be limited to particular embodiments described or shown herein.

FIG. 2A illustrates one embodiment of an "MPLO circuit portion." Plural MPLO circuit portions form an MPLO 210. In the example described in this specification, four MPLO circuit portions output 2M signals $\phi M$, including $\phi 1$, $\phi 1-$, $\phi 2$, $\phi 2-$, $\phi 3$, $\phi 3-$, $\phi 4$, $\phi 4-$, $\phi 5$, $\phi 5-$, $\phi 6$, $\phi 6-$. In that embodiment, $\phi x$ and $\phi x-$ are of opposite phase for all x. Thus, the MPLO circuit portion in FIG. 2A illustrates the generation of only three of the twelve signals, namely, $\phi 1$, φ2, φ3. In that embodiment, signals φ1, φ2, φ3 are interpolated between I and Q− input signals with evenly spaced phase shift.

For brevity and to avoid clutter, detailed illustrations of the three MPLO circuit portions generating the nine phase signals other than φ1, φ2, φ3 are not provided. It is understood that these other three MPLO circuit portions respectively provide signals φ1−, φ2−, φ3−; signals φ4, φ5, φ6; and signals φ4−, φ5−, φ6−. It is understood that diagrams of the three other MPLO circuit portions may be structured in the same manner shown in FIG. 2A, but receive corresponding inputs and provide corresponding outputs according to Table I:

TABLE I

| MPLO "Circuit Portions" | MPLO Inputs/Outputs (FIG. 2A) | | | | |
|---|---|---|---|---|---|
| | First Input | Second Input | First Output | Second Output | Third Output |
| FIG. 2A: | I | Q− | φ1 | φ2 | φ3 |
| (not illustrated) | Q | I | φ4 | φ5 | φ6 |
| (not illustrated) | I− | Q | φ1− | φ2− | φ3− |
| (not illustrated) | Q− | I− | φ4− | φ5− | φ6− |

Figure 2D:
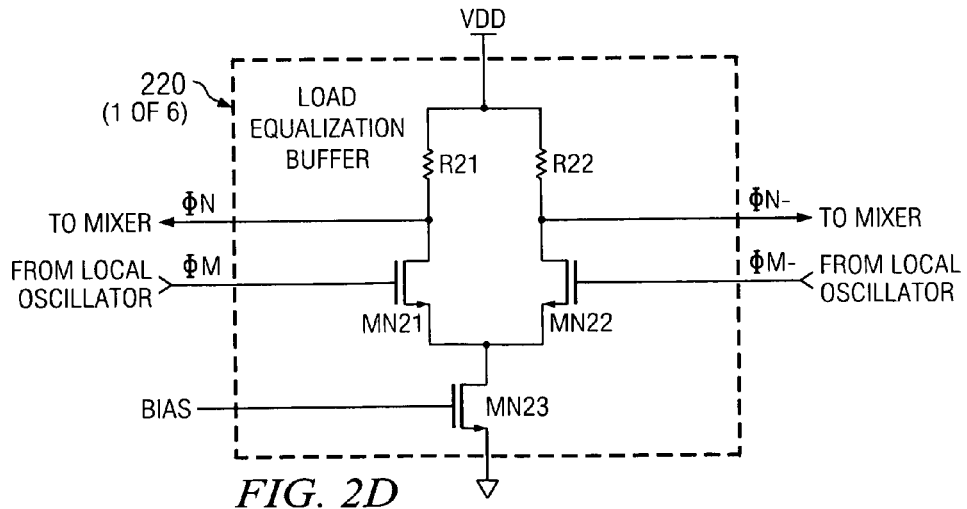
FIG. 2D illustrates one example of a load equalization buffer 220 (FIG. 2) that connects the outputs of MPLO circuit portions (FIGS. 2A, 2B, 2C) of MPLO 210 (FIG. 2) with the inputs of harmonic rejection mixer 230 (FIGS. 2, 2E)

FIGS. 2B and 2C provide an "exterior" view of the MPLO circuit portions collectively, to show their interconnections. More specifically, FIG. 2B illustrates how the MOSFET gate inputs of the circuit portions of FIG. 2A may be driven by I, Q, I−, Q− input signals, while FIG. 2C illustrates one example of how the drains and sources of the circuit portions of FIG. 2A may be connected. In FIGS. 2B, 2C, the boxes labeled 1, 1−, 2, 2−, 3, 3−, 4, 4", 5, 5−, 6, 6− provide corresponding output signals φ1, φ1−, φ2, φ2−, φ3, φ3−, φ4, φ4−, φ5, φ5−, φ6, φ6− to the load equalization buffers 220 (FIGS. 2, 2D). The three dotted-line boxes 1, 2, 3 in FIG. 2A correspond to the solid boxes labeled 1, 2, 3 (in FIGS. 2B, 2C) that provide respective signals φ1, φ2, φ3 in (FIG. 2C).

Referring more specifically to the MPLO circuit portion in FIG. 2A, input signal I is provided to the drain and gate of a MOSFET MNI, whose source is grounded. MOSFET MNI thus operates as a so-called "MOSFET diode," performing a current mirror function in a manner known in the art. Input signal I is input to the gates of MOSFETs MN1I, MN2I, MN3, as well as to an adjacent MPLO circuit portion that is to the "right" of the circuit portion of FIG. 2A. As an aside, FIG. 2B shows that signal I is provided to the adjacent MPLO circuit portion that includes boxes 4, 5, 6, and that I is input only to 4 and 5 but not to 6.

Input signal Q− is also provided to the circuit portion in FIG. 2A. Q−'s current mirror MOSFET diode is not explicitly illustrated because it is located another MPLO circuit portion diagram that has the same structure as FIG. 2A, but located to the "left" of the MPLO circuit portion of FIG. 2A. Q− is input to the gates of MOSFETs MN1Q− and MN2Q−.

In FIG. 2A, oscillator output signals φ1, φ2, φ3 are provided at the joined drains of MN1Q−, MN1I; at the joined drains of MN2Q−, MN2I; and at the drain of MN3, respectively. Signals φ1, φ2, φ3 are connected to VDD through respective resistors R1, R2, R3. Signal φ3 has a further resistor R33 inserted in series between VDD and R3, with the node between R33 and R3 also being connected to a resistor R3− (not shown in FIG. 2A but see FIG. 2C). R3− is the resistor pulling up the signal φ3− that is opposite in phase to φ3. R33 and R66 provide the common mode adjustment for the buffered I, I−, Q, Q− signals so that the associated oscillation voltage common modes are the same as the interpolated oscillation voltage common mode.

Essentially, through choice of weighting of the MOSFETs in FIG. 2A by choosing device width, output signals φ1, φ2, φ3 are created as interpolated phase signals. That is, the phases of φ1, φ2, φ3 are between the phase of I and the phase of Q−. Speaking more precisely, the phase of oscillator output signal φ3 essentially matches the phase of input signal I because I is the only input signal driving MOSFET MN3; however, within this disclosure the dotted line boxes 1, 2, 3 in FIG. 2A (and corresponding solid boxes in FIGS. 2B, 2C) are considered to be phase "interpolation" circuits even if some of the output phases exactly match one of the input phases.

Collectively, four MPLO circuit portions provide twelve output signals φ1, φ2, φ3, φ4, φ5, φ6, φ1−, φ2−, φ3−, φ4−, φ5−, φ6 that are mutually distinct in phase. In one embodiment, these twelve output signals are evenly spaced in phase, being thirty degrees apart from neighboring signals.

To achieve phase interpolation, an approach based on combining selectively weighted electrical currents may be used. Herein, "SQRT" or "$\sqrt{\ }$" is the arithmetic square root function.

In FIG. 2A, φ1 is made to have a phase that is thirty degrees away from Q− but sixty degrees away from I, by fabricating MN1Q− to have SQRT(3) times the width of MN1I so that control input Q− controls SQRT(3) times as much current as I controls. Symbolically:

$$1/2 \cos(\omega t) - SQRT(3)/2 \sin(\omega t)$$
$$= \sin(30°)\cos(\omega t) - \cos(30°)\sin(\omega t)$$
$$= -\sin(\omega t - 30°)$$

Likewise, φ2 is made to have a phase that is thirty degrees away from I but sixty degrees away from I, by fabricating MN2I to have SQRT(3) times the width as MN2Q− so that control input I controls SQRT(3) times as much current as Q− controls.

MN3 is controlled only by I so that the phase of φ3 is substantially the same as the phase of I.

In operation, the current interpolation network in MPLO 210 generates an arbitrarily large number (here, 2M=12) phases based on two pairs of differential I/Q sinusoidal inputs (see especially FIG. 2B). The current interpolation weighting provides the correct current interpolation, and RC loading of each phase equalizes RC loading.

The relative MOSFET weighting and relative resistor value determination in a particular example of the MPLO circuit portion is now presented with reference to Table II. Preliminarily, the numerical values 2.37, 1.37, and 0.366 are arrived at as follows:

$$(1 + \sqrt{3})\frac{\sqrt{3}}{2} \approx 2.37$$

and $$\frac{(1 + \sqrt{3})}{2} \approx 1.37$$

and $$\frac{1}{(1 + \sqrt{3})} \approx 0.366$$

TABLE II

MPLO MOSFET Weighting, Resistance Values

| MPLO | | Relative Weighting (MOSFET width) | | Relative |
|---|---|---|---|---|
| "Circuit Portion" | Phase Signal Output | "Left" MOSFET | "Right" MOSFET | Resistance Values |
| FIG. 2A | Φ1 | 2.37 | 1.37 | R1 = 0.366 |
|  | Φ2 | 1.37 | 2.37 | R2 = 0.366 |
|  | Φ3 ≈I | 2.0 | N/A | R3 = 0.5 |
| (not illustrated; | Φ4 | 2.37 | 1.37 | R4 = 0.366 |
| same pattern as | Φ5 | 1.37 | 2.37 | R5 = 0.366 |
| FIG. 2A) | Φ6 ≈Q | 2.0 | N/A | R6 = 0.5 |
| (not illustrated; | Φ1− | 2.37 | 1.37 | R1− = 0.366 |
| same pattern as | Φ2− | 1.37 | 2.37 | R2− = 0.366 |
| FIG. 2A) | Φ3− ≈I− | 2.0 | N/A | R3− = 0.5 |
| (not illustrated; | Φ4− | 2.37 | 1.37 | R4− = 0.366 |
| same pattern as | Φ5− | 1.37 | 2.37 | R5− = 0.366 |
| FIG. 2A) | Φ6− ≈Q− | 2.0 | N/A | R6− = 0.5 |

FIG. 2C provides an "exterior" perspective how the drains and sources of MOSFETS in the four MPLO circuit portions are connected. Resistors R1 through R6, and resistors R1− through R6−, are connected between supply voltage VDD and blocks 1 through 6, and blocks 1− through 6−, respectively. Common mode voltages of some of the phases (namely, φ3 and φ3−, as well as φ6 and φ6−) are adjusted through resistors R33 & R66, respectively. More specifically, R33 is connected between VDD and a node common to R3 and R3−; and R66 is connected between VDD and a node common to R6 and R6−.

The outputs of blocks 1 through 6, and blocks 1− through 6−, are φ1, φ2, φ3, φ4, φ5, φ6, and φ1−, φ2−, φ3−, φ4−, φ5−, φ6−, respectively. The outputs are provided at the joined drains of the MOSFETs (see again, FIG. 2A).

Figure 2E:
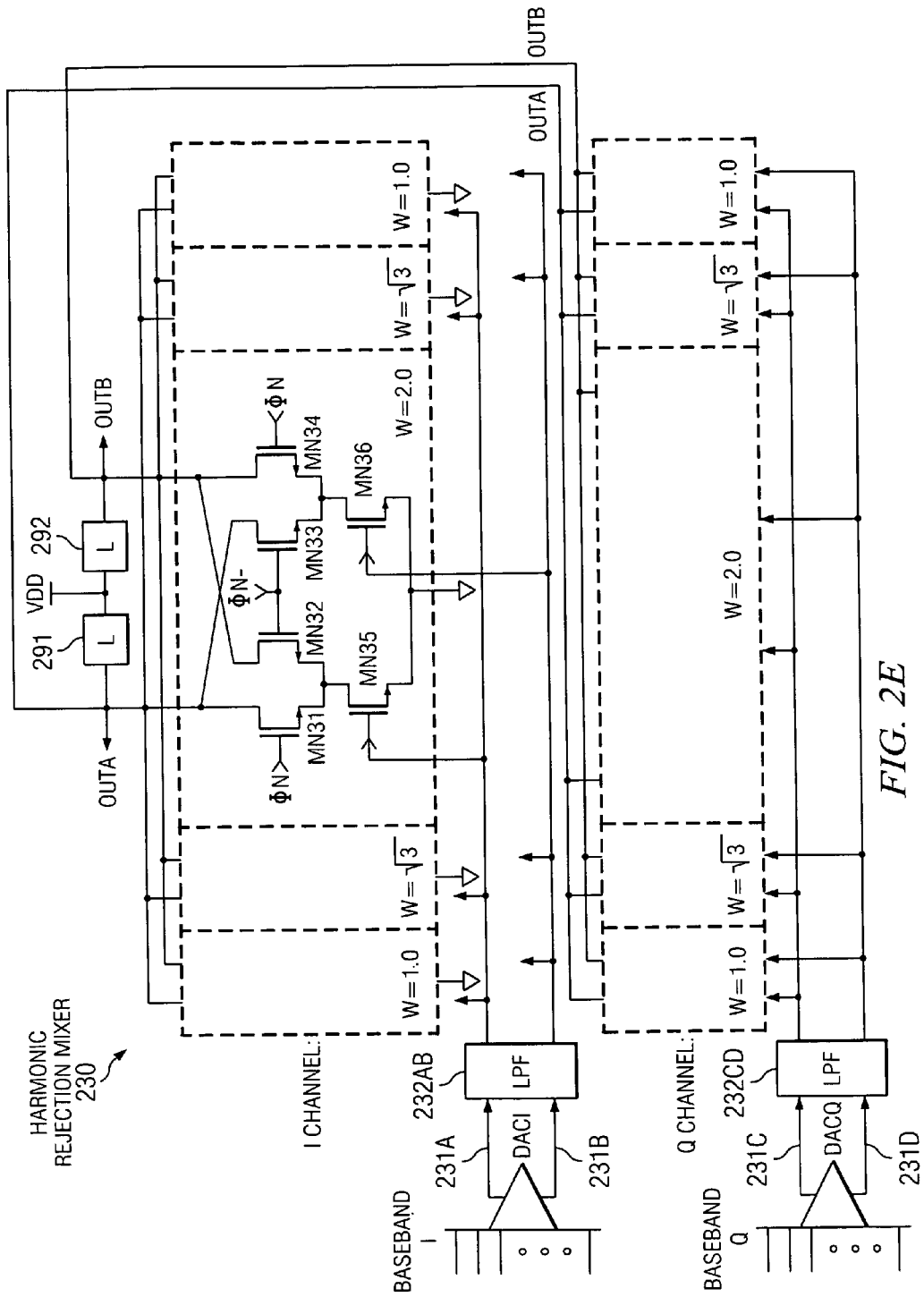
FIG. 2E illustrates one example of a harmonic rejection mixer (HRM) 230 (FIG. 2), an HRM having two sets of five HRM "legs" having five respective weighting factors W.

FIG. 2D illustrates one embodiment of a load equalization buffer 220 (FIG. 2) that receives the outputs φM of MPLO circuit portions (FIG. 2A, 2B, 2C) of MPLO 210 (FIG. 2) and provides load-equalized outputs φN to harmonic rejection mixer 230 (FIGS. 2, 2E). It is understood that in this example, the circuit of FIG. 2D is present a total of M=N=6 times, to provide the six pairs of signals (φ1, φ1−) through (φ6, φ6−).

In FIG. 2D, the drains of two opposed MOSFETs MN21, MN22 are connected to VDD through respective resistors R21, R22. The sources of the MOSFETS are joined together and to the drain of a bias MOSFET MN23, whose source is in turn connected to ground. The gate of bias MOSFET MN23 receives a BIAS signal that ensures proper operation of opposed MOSFETs MN21, MN22.

Corresponding input signals φM and φM− from MPLO 210 are differential voltage output signals. Signals φM and φM− are input to the gates of opposed MOSFETs MN21, MN22, respectively. The load equalization buffers collectively provide as many as M=N pairs of differential output signals to the harmonic rejection mixer (HRM) 230. In FIG. 2D, the differential output signals are individually labeled φN and φN−, and are provided at the drains of opposed MOSFETs MN21, MN22. It is understood that, in the present description, M and N may be used as index values 1, 2, 3, 4, 5, 6, as well as the maximum value the index can assume; φm and φn generally refer to individual index values.

To help achieve load equalization, the devices in the various (for example, six) load equalization buffers are properly chosen. Weighting (W), or buffer strength, is achieved by proportionately increasing device widths of MOSFETs MN21, MN22, MN23. To compensate for increased device width, the values of drain resistors R21, R22 are made inversely proportional to weighting W. The values given in Table III are relative values, rather than absolute device widths or ohm values; in practice, the width and resistance values vary with the semiconductor technology and with the particular application. The values 2.73, 0.366 and 0.5 are arrived at as follows:

$$1 + \sqrt{3} \approx 2.73$$

and its reciprocal:

$$\frac{1}{(1+\sqrt{3})} \approx 0.366$$

Also:

$$\frac{1}{2.0} = 0.5$$

TABLE III

Load Equalization Buffers 220 (FIG. 2D)

| Buffer (FIG. 2D) | Inputs (φM) from MPLO | | Outputs (φN) to HRM | | Relative Weighting Factor W | Relative Resistance (α 1/W) |
|---|---|---|---|---|---|---|
| 220-1 | φ1 | φ1− | φ1 | φ1− | 2.73 | 0.366 |
| 220-2 | φ2 | φ2− | φ2 | φ2− | 2.73 | 0.366 |
| 220-3 | φ3 | φ3− | φ3 | φ3− | 2.0 | 0.5 |
| 220-4 | φ4 | φ4− | φ4 | φ4− | 2.73 | 0.366 |
| 220-5 | φ5 | φ5− | φ5 | φ5− | 2.73 | 0.366 |
| 220-6 | φ6 | φ6− | φ6 | φ6− | 2.0 | 0.5 |

The relative weighting and resistance values for a given Table III buffer may be "back-calculated" based on the required strengths of semiconductor devices (for example, MOSFETs) in the HRM that the buffer drives. Generally, phase signals that drive higher-strength HRM require proportionately greater weighting. One example of this back-calculation (for φ1) is explained below, with reference to Table IV.

R33 and R66 provide for common mode adjustment that is required for phases φ3, φ6, φ3−and φ6−. The common mode level for I (φ3), Q (φ6), I− (φ3−), and Q− (φ6−) is different than for the phases interpolated between them, namely, φ1, φ2, φ4, φ5, φ1−, φ2−, φ4−, φ5−. The values of R33, R66 are determined so that the DC biased voltages of all φNs are the same. For example, from TABLE II, the relative DC-biased voltage of φ1 is VDD minus the voltage across resistor R1. Symbolically:

$$VDD - V_{R1} = VDD - (2.37 + 1.37) * 0.366 = VDD - 1.3688$$

in which:

VDD is the supply voltage;

$V_{R1}$ is the voltage across resistor R1 (FIG. 2A);

(2.37+1.37) is the sum of the device widths of MOSFETs MN1Q− and MN1I (FIG. 2A), which sum indicates the effective current through R1; and 0.366 is the relative resistance value of R1.

The DC-biased voltage of φ3 should be made equal to the DC-biased voltage of φ1 (VDD−1.3688, from above). Symbolically, the DC-biased voltage of φ3, also calculated using Table II, is:

$$VDD - (V_{R33} + V_{R3}) = VDD - (I_{R33}R_{33} + I_{R3}R_3)$$
$$= VDD - ((2+2)R_{33} + 2(0.5))$$
$$= VDD - (4R_{33} + 1.0)$$

Setting the DC-biased voltage values for $\phi1$ and $\phi3$ to be equal:

$$VDD-1.3688=VDD-(4R_{33}+1.0)$$

and eliminating VDD and the minus signs from both sides of the equation, yields:

$$1.3688=4R_{33}+1.0$$

Solving for $R_{33}$:

$$R_{33}=(1.3688-1.0)/4=0.3688/4=0.0922$$

in which:
- $V_{R33}$ and $V_{R3}$ are voltages across R33 and R3, respectively; and
- $I_{R33}$ and $I_{R3}$ are currents through R33 and R3, respectively, represented by device widths from Table II; it is understood that the current through R33 is twice that through R3 (see FIG. 2C).

The value of R66 is calculated in a similar fashion.

FIG. 2E illustrates one example of a harmonic rejection mixer (HRM) 230 (FIG. 2). In this example, two HRM portions are shown: a first portion for the I Channel and a second portion for the Q Channel. The two HRM portions drive a common output load 291, 292. The two HRM portions receive I and Q signals, respectively, that are analogous to the I and Q inputs in the Weldon et al. reference (see FIG. 1). Whereas Weldon et al. combine the outputs of two HRMs by adder elements, FIG. 2E simplifies the combining function by showing a "hard wiring" of the HRM portion outputs together at OUTA and OUTB output nodes.

In FIG. 2E, I and Q baseband input signals are input respective digital-to-analog converters (DACs), labeled DACI and DACQ. DACI and DACQ provide differential current signals 231A, 231B and 231C, 231D to respective low pass filters (LPFs) 232A, 232B and 232C, 232D. Signals 231A, 231B, 231C, 231D collectively represent the differential baseband input signal 231 (FIG. 2).

LPF 232A drives the gate of MN35 in all five legs of the I-channel HRM portion, and LPF 232B drives the gate of MN36 in all five legs of the I-channel HRM portion. Likewise, if a Q Channel is present, LPF 232C drives the gate of MN35 in all five legs of the Q-channel HRM portion, and LPF 232D drives the gate of MN36 in all five legs of the Q-channel HRM portion.

Many implementations have only a single channel, rather then two quadrature channels I and Q. In that event, only a single HRM portion is required; that is, only the top half of FIG. 2E would be required.

In this example, each HRM portion has five HRM "legs" having five respective weighting factors W. FIG. 2E shows that the five-leg mixer uses the LO input signals $\phi$N, $\phi$N- as switching signals (N can be 1 through 6 in this example). By weighting the five legs appropriately, the rail-to-rail LO signal can be used while rejecting more harmonics than are rejected by conventional arrangements.

For simplicity in illustration, FIG. 2E shows all but one "leg" in phantom, and the ground connections in the Q Channel HRM portion are omitted to avoid clutter. The circuit of the third leg of the I-channel HRM portion is shown in detail, with the understanding that all legs may be similarly designed.

Referring more specifically to the third leg of the I-channel HRM portion, the sources of a first pair of opposed MOSFETs MN31, MN32 are selectively connected to ground through a MOSFET MN35 whose gate is driven by a first baseband input signal 231A. Likewise, the sources of a second pair of opposed MOSFETS MN33, MN34 are selectively connected to ground through a MOSFET MN36 whose gate is driven by a differential baseband input signal 231B. The gates of MN32 and MN33 are connected and are driven by $\phi$N– while the gates of MN31 and MN34 are connected and are driven by $\phi$N.

The drains of MN31 and MN33 are connected, to form a node at which HRM output signal OUTA is provided. Likewise, the drains of MN32 and MN34 are connected, to form a node at which HRM output signal OUTB is provided.

Essentially, within each "leg" of the HRM 230, the differential current signals $\phi$N, $\phi$N– are modulated by the data signals input to MN35, MN36, to provide modulated intermediate frequency (IF) or high-frequency (HF) output signals at the OUTA and OUTB outputs.

The drains of MOSFETS in the four "phantom" legs of HRM 230 are connected in a manner analogous to the leg that is explicitly illustrated, the drains also being connected to the OUTA and OUTB nodes. To provide output signals that closely emulate a sinusoidal signal, the "legs" of the HRM are differently weighted with weight factors W. In this example having five legs:
- the first and fifth legs are weighted with W=1.0,
- the second and fourth legs are weighted with W=SQRT (3)≈1.73, and
- the third leg is weighted with W=2.0.

SQRT designates the square root function.

This weighting is achieved by strategically fabricating MOSFETs in the respective HRM legs. To achieve greater weighting, the MOSFETs in a given HRM leg are fabricated proportionately larger. For example, to provide an HRM leg with a weighting factor W=2, MOSFETs within that leg are fabricated twice as wide as MOSFETs in legs with a weighting factor W=1.

The HRM example described herein has both I and Q Channels, and uses all twelve evenly spaced phases $\phi1$, $\phi2$, $\phi3$, $\phi4$, $\phi5$, $\phi6$, $\phi1–$, $\phi2–$, $\phi–$, $\phi4–$, $\phi5–$, $\phi6–$ from the buffered MPLO. However, in the event that only a single channel is present rather than separate I and Q channels, then less than all twelve phases would be used since only five pairs of phases are needed by five HRM legs. For example, $\phi3$ and $\phi3–$ are not used in the I Channel portion alone, and $\phi6$ and $\phi6–$ are not used in the Q Channel portion alone.

The buffered phase signals $\phi$N and $\phi$N– are input to the respective legs of the HRM, as shown in Table IV. Here, the value 1.73 approximates $\sqrt{3}$.

TABLE IV

Harmonic Rejection Mixer (HRM) (FIG. 2E)

| Channel | "Leg" of HRM | Input ($\Phi$N) to MN31, MN34 | Input ($\Phi$N–) to MN32, MN33 | Relative Strength |
|---|---|---|---|---|
| I Channel | First[B] | $\Phi4–$ | $\Phi4$ | 1.0 |
|  | Second[B] | $\Phi5–$ | $\Phi5$ | 1.73 |
|  | Third[A] | $\Phi6–$ | $\Phi6$ | 2.0 |
|  | Fourth[B] | $\Phi1$ | $\Phi1–$ | 1.73 |
|  | Fifth[B] | $\Phi2$ | $\Phi2–$ | 1.0 |

TABLE IV-continued

Harmonic Rejection Mixer (HRM) (FIG. 2E)

| Channel | "Leg" of HRM | Input (ΦN) to MN31, MN34 | Input (ΦN−) to MN32, MN33 | Relative Strength |
|---|---|---|---|---|
| Q Channel | First[B] | Φ1 | Φ1− | 1.0 |
| | Second[B] | Φ2 | Φ2− | 1.73 |
| | Third[B] | Φ3 | Φ3− | 2.0 |
| | Fourth[B] | Φ4 | Φ4− | 1.73 |
| | Fifth[B] | Φ5 | Φ5− | 1.0 |

Notes:
[A]Circuit of Third Leg of I Channel is detailed in FIG. 2E.
[B]Not specifically illustrated in FIG. 2E.

The need for load equalization in buffers 220 may now be understood by an example. Table IV shows that φ1 is input to the fourth leg of the I Channel HRM portion (Strength=1.73) and to the first leg of the Q Channel HRM portion (Strength=1.0). Accordingly, the weighting W of φ1 must therefore be the sum 1.73+1.0=2.73, a sum that is reflected in Table III, above.

Simulations have been conducted on the embodiment described herein, using twelve MPLO phases plus the five-leg harmonic rejection mixer with the device weighting shown in FIG. 2E. Harmonic rejection results were very favorable. The simulated arrangement rejected the third, fifth, seventh, and ninth harmonics. Surviving harmonics include the eleventh, thirteenth, twenty-third, and twenty-fifth harmonics. This result contrasts favorably with Weldon's results, in which only the third and fifth harmonics were rejected but the seventh and ninth harmonics were not successfully rejected. Accordingly, the present arrangement provides an output frequency profile in which the surviving harmonics are fewer in number and located further from the fundamental frequency, so that the surviving harmonics are much easier to filter out, even using conventional filtering techniques.

The present disclosure provides support for a circuit for providing a reduced harmonic content output signal (OUTA and/or OUTB) that is modulated according to an input signal (231). The circuit has an oscillator circuit (210) including at least one circuit portion (FIG. 2A) configured to receive first and second orthogonal oscillator input signals (at least two of I, I−, Q, Q−) having respective first and second phases, and to provide plural oscillator output signals (φm) having respective mutually distinct phases that are interpolated between the first and second phases. The circuit also has a harmonic rejection mixer (FIG. 2E) configured to use the input signal to modulate a combination of the oscillator output signals, the oscillator output signals being respectively weighted so as to provide an emulated sinusoidal signal constituting the reduced harmonic content output signal.

The oscillator circuit may be configured to provide the oscillator output signals (φm) in response to only a first pair of orthogonal oscillator input signals (example: I, Q) and a second pair of orthogonal oscillator input signals (example: I−, Q−) that are opposite in phase to the first pair (example: I, Q) of orthogonal oscillator input signals.

The oscillator input signals (I, I−, Q, Q−) may be of a same frequency as the oscillator output signals, and are not derived from a frequency-division of higher frequency oscillator input signals.

At least one of the circuit portions (FIG. 2A) may include at two phase interpolation circuits (1 and/or 2 for φ1 and φ2 in FIG. 2A), each phase interpolation circuit being configured to provide a respective one of the oscillator output signals (φm) by combining at least two weighted oscillator input signals (two of I, I−, Q, Q−).

The oscillator circuit may include exactly four circuit portions, including a first circuit portion receiving I and Q− orthogonal oscillator input signals; a second circuit portion receiving I and Q orthogonal oscillator input signals; a third circuit portion receiving I− and Q orthogonal oscillator input signals; and a fourth circuit portion receiving I− and Q− orthogonal oscillator input signals; in which I and I− are of opposite phase, and Q and Q− are of opposite phase.

The first circuit portion may provide at least first and second oscillator output signals having first and second phases interpolated between phases of I and Q−; the second circuit portion may provide at least third and fourth oscillator output signals having first and second phases interpolated between phases of I and Q; the third circuit portion may provide at least fifth and sixth oscillator output signals having first and second phases interpolated between phases of I− and Q; and the fourth circuit portion may provide at least seventh and eighth oscillator output signals having first and second phases interpolated between phases of I− and Q−.

The first circuit portion may provide a ninth oscillator output signal having a phase substantially matching that of one of the I or Q− orthogonal oscillator input signals; the second circuit portion may provide a tenth oscillator output signal having a phase substantially matching that of one of the I or Q orthogonal oscillator input signals; the third circuit portion may provide an eleventh oscillator output signal having a phase substantially matching that of one of the I− or Q orthogonal oscillator input signals; and the fourth circuit portion may provide a twelfth oscillator output signal having a phase substantially matching that of one of the I− or Q− orthogonal oscillator input signals.

The oscillator output signals (Om) may be equally spaced in phase.

The circuit may also have an array of load equalization buffers (220) configured to weight the oscillator output signals in accordance with a strength of legs forming the harmonic rejection mixer, the strength of the legs being determined by how much each leg contributes to the reduced harmonic output signal (OUTA and/or OUTB).

At least one of the circuit portions (FIG. 2A) may include at two phase interpolation circuits (1 and/or 2 for φ1 and φ2 in FIG. 2A), each phase interpolation circuit being configured to provide a respective one of the oscillator output signals (φm) by performing a weighted summing of currents respectively representing at least two oscillator input signals (two of I, I−, Q, Q−).

The present disclosure also supports a method for providing a reduced harmonic content output signal (OUTA and/or OUTB) that is modulated according to an input signal. The method may involve receiving first and second orthogonal oscillator input signals (at least two of I, I−, Q, Q−) having respective first and second phases; providing plural oscillator output signals (φM) having respective mutually distinct phases that are interpolated between the first and second phases; and using the input signal to modulate a combination of the oscillator output signals, respectively weighted so as to provide an emulated sinusoidal signal constituting the reduced harmonic content output signal.

The providing step may include providing the oscillator output signals (φm) in response to only a first pair of orthogonal oscillator input signals (example: I, Q) and a second pair of orthogonal oscillator input signals (example: I−, Q−) that are opposite in phase to the first pair (example: I, Q) of orthogonal oscillator input signals.

The oscillator input signals (I, I−, Q, Q−) may be of a same frequency as the oscillator output signals, and are not derived from a frequency-division of higher frequency oscillator input signals The providing step may include providing the oscillator output signals (φm) by combining at least two weighted oscillator input signals (two of I, I−, Q, Q−).

The receiving step may consist essentially of receiving I and Q− orthogonal oscillator input signals; receiving I and Q orthogonal oscillator input signals; receiving I− and Q orthogonal oscillator input signals; and receiving I− and Q− orthogonal oscillator input signals; in which I and I− are of opposite phase, and Q and Q− are of opposite phase.

The providing step may include outputting at least first and second oscillator output signals having first and second phases interpolated between phases of I and Q−; outputting at least third and fourth oscillator output signals having first and second phases interpolated between phases of I and Q; outputting at least fifth and sixth oscillator output signals having first and second phases interpolated between phases of I− and Q; and outputting at least seventh and eighth oscillator output signals having first and second phases interpolated between phases of I−and Q−.

The providing step may include outputting a ninth oscillator output signal having a phase substantially matching that of one of the I or Q− orthogonal oscillator input signals; outputting a tenth oscillator output signal having a phase substantially matching that of one of the I or Q orthogonal oscillator input signals; outputting an eleventh oscillator output signal having a phase substantially matching that of one of the I− or Q orthogonal oscillator input signals; and outputting a twelfth oscillator output signal having a phase substantially matching that of one of the I− or Q− orthogonal oscillator input signals.

The providing step may include providing oscillator output signals (φm) that are equally spaced in phase.

The method may also includes weighting the oscillator output signals in accordance with a strength of legs forming a harmonic rejection mixer that performs the using step, the strength of the legs being determined by how much each leg contributes to the reduced harmonic output signal (OUTA and/or OUTB).

The providing step may include providing the oscillator output signals (φm) by performing a weighted summing of currents that respectively represent at least two oscillator input signals (two of I, I−, Q, Q−).

Many alternatives, modifications, and variations will be apparent to those skilled in the art in light of the above teachings. For example, varying the choice of the number of phases generated by the multi-phase local oscillator (MPLO), the particular input signals to the MPLO, the phase-spacing of signals generated by the MPLO, the manner in which weighting is achieved to achieve interpolation of the LO phase signals, the manner in which the HRM legs are weighted, the choice of current domain signals versus voltage domain signals, and so forth, all lie within the contemplation of the present invention. It is therefore to be understood that within the scope of the appended claims and their equivalents, the invention may be practiced otherwise than as specifically described herein.

What is claimed is:

1. A circuit for providing a reduced harmonic content output signal that is modulated according to an input signal, the circuit comprising:

an oscillator circuit including at least one circuit portion configured to receive first and second orthogonal oscillator input signals having respective first and second phases, and to provide plural oscillator output signals having respective mutually distinct phases that are interpolated between the first and second phases;

a harmonic rejection mixer configured to use the input signal to modulate a combination of the oscillator output signals, the oscillator output signals being respectively weighted so as to provide an emulated sinusoidal signal constituting the reduced harmonic content output signal; and an array of load equalization buffers configured to weight the oscillator output signals in accordance with a strength of legs forming the harmonic rejection mixer, the strength of the legs being determined by how much each leg contributes to the reduced harmonic output signal.

2. The circuit of claim 1, wherein:

the oscillator circuit is configured to provide the oscillator output signals in response to only a first pair of orthogonal oscillator input signals and a second pair of orthogonal oscillator input signals that are opposite in phase to the first pair of orthogonal oscillator input signals.

3. The circuit of claim 2, wherein:

the oscillator input signals are of a same frequency as the oscillator output signals, and are not derived from a frequency-division of higher frequency oscillator input signals.

4. The circuit of claim 1, wherein at least one of the circuit portions (FIG. 2A) includes:

at two phase interpolation circuits, each phase interpolation circuit being configured to provide a respective one of the oscillator output signals by combining at least two weighted oscillator input signals.

5. The circuit of claim 1, wherein the oscillator circuit includes exactly four circuit portions, including a first circuit portion receiving I and Q− orthogonal oscillator input signals;

a second circuit portion receiving I and Q orthogonal oscillator input signals;

a third circuit portion receiving I− and Q orthogonal oscillator input signals; and a fourth circuit portion receiving I− and Q− orthogonal oscillator input signals;

and wherein:

I and I− are of opposite phase; and

Q and Q− are of opposite phase.

6. The circuit of claim 5, wherein:

the first circuit portion provides at least first and second oscillator output signals having first and second phases interpolated between phases of I and Q−;

the second circuit portion provides at least third and fourth oscillator output signals having first and second phases interpolated between phases of I and Q;

the third circuit portion provides at least fifth and sixth oscillator output signals having first and second phases interpolated between phases of I− and Q; and the fourth circuit portion provides at least seventh and eighth oscillator output signals having first and second phases interpolated between phases of I− and Q−.

7. The circuit of claim 6, wherein:

the first circuit portion provides a ninth oscillator output signal having a phase substantially matching that of one of the I or Q− orthogonal oscillator input signals;

the second circuit portion provides a tenth oscillator output signal having a phase substantially matching that of one of the I or Q orthogonal oscillator input signals;

the third circuit portion provides an eleventh oscillator output signal having a phase substantially matching that of one of the I– or Q orthogonal oscillator input signals; and the fourth circuit portion provides a twelfth oscillator output signal having a phase substantially matching that of one of the I– or Q– orthogonal oscillator input signals.

8. The circuit of claim 1, wherein:
the oscillator output signals are equally spaced in phase.

9. The circuit of claim 1, wherein at least one of the circuit portions includes:
at two phase interpolation circuits, each phase interpolation circuit being configured to provide a respective one of the oscillator output signals by performing a weighted summing of currents respectively representing at least two oscillator input signals.

10. A method for providing a reduced harmonic content output signal that is modulated according to an input signal, the method comprising:
receiving first and second orthogonal oscillator input signals having respective first and second phases;
providing plural oscillator output signals having respective mutually distinct phases that are interpolated between the first and second phases;
using the input signal to modulate a combination of the oscillator output signals, respectively weighted so as to provide an emulated sinusoidal signal constituting the reduced harmonic content output signal; and
weighting the oscillator output signals in accordance with a strength of legs forming a harmonic reiection mixer that rerforms the using ster, the strength of the legs being determined by how much each leg contributes to the reduced harmonic outrut signal.

11. The method of claim 10, wherein the providing step includes:
providing the oscillator output signals in response to only a first pair of orthogonal oscillator input signals and a second pair of orthogonal oscillator input signals that are opposite in phase to the first pair of orthogonal oscillator input signals.

12. The method of claim 11, wherein:
the oscillator input signals are of a same frequency as the oscillator output signals, and are not derived from a frequency-division of higher frequency oscillator input signals.

13. The method of claim 10, wherein the providing step includes:
providing the oscillator output signals by combining at least two weighted oscillator input signals.

14. The method of claim 10, wherein the receiving step consists essentially of:
receiving I and Q– orthogonal oscillator input signals;
receiving I and Q orthogonal oscillator input signals;
receiving I– and Q orthogonal oscillator input signals; and
receiving I– and Q– orthogonal oscillator input signals;
and wherein:
I and I– are of opposite phase; and Q and Q– are of opposite phase.

15. The method of claim 14, wherein the providing step includes:
outputting at least first and second oscillator output signals having first and second phases interpolated between phases of I and Q–;
outputting at least third and fourth oscillator output signals having first and second phases interpolated between phases of I and Q;
outputting at least fifth and sixth oscillator output signals having first and second phases interpolated between phases of I– and Q; and
outputting at least seventh and eighth oscillator output signals having first and second phases interpolated between phases of I– and Q–.

16. The method of claim 15, wherein the providing step includes:
outputting a ninth oscillator output signal having a phase substantially matching that of one of the I or Q– orthogonal oscillator input signals;
outputting a tenth oscillator output signal having a phase substantially matching that of one of the I or Q orthogonal oscillator input signals;
outputting an eleventh oscillator output signal having a phase substantially matching that of one of the I– or Q orthogonal oscillator input signals; and
outputting a twelfth oscillator output signal having a phase substantially matching that of one of the I– or Q– orthogonal oscillator input signals.

17. The method of claim 10, wherein the providing step includes:
providing the oscillator output signals equally spaced in phase.

18. The method of claim 11, wherein the providing step includes:
providing the oscillator output signals by performing a weighted summing of currents that respectively represent at least two oscillator input signals.

* * * * *